United States Patent [19]

Celeste

[11] 3,770,438

[45] Nov. 6, 1973

[54] PHOTOPOLYMERIZABLE TRANSFER ELEMENTS

[76] Inventor: Jack Richard Celeste, 40 Cameron Ct., Freehold, N.J. 07728

[22] Filed: Dec. 9, 1971

[21] Appl. No.: 206,532

Related U.S. Application Data

[63] Continuation-in-part of Ser. No. 78,181, Oct. 5, 1970, abandoned.

[52] U.S. Cl. ........................ 96/67, 96/115 P, 96/28

[51] Int. Cl. ........................ G03c 11/12

[58] Field of Search ........................ 96/115 P, 28, 67

[56] References Cited

UNITED STATES PATENTS

| | | | |
|---|---|---|---|
| 3,353,955 | 11/1967 | Colgrove | 96/28 |
| 3,615,435 | 10/1971 | Chu | 96/115 P |
| 3,198,633 | 8/1965 | Cohen et al. | 96/28 |
| 3,615,567 | 10/1971 | Wilson | 96/115 P |
| 3,661,588 | 5/1972 | Chang | 96/115 P |

*Primary Examiner*—Norman G. Torchin
*Assistant Examiner*—Richard L. Schilling
*Attorney*—Wilkin E. Thomas, Jr.

[57] ABSTRACT

A photopolymerizable film element is made by coating a photopolymerizable composition onto an actinically transparent support, drying, and laminating it with a temporary protective cover sheet or to a surface to be imaged. The photopolymerizable composition comprises a mixture of an organic binder, an ethylenically unsaturated monomer, and an initiating system. The monomer is present in an amount in excess of the absorptive capacity of the binder for monomer, so that a thin layer of substantially free monomer forms on the monomer-binder layer upon drying. The optical density of the photopolymerizable layer, in the actinic region of the exposure, must be no greater than 0.7 and the thickness of the dried layer must be at least 0.00005 inch. The support for the photopolymerizable composition must have greater adhesion to the unexposed photopolymerizable layer than that exhibited by the cover sheet, and less adhesion to the exposed photopolymer layer than that exhibited by the cover sheet or the surface to be imaged.

10 Claims, No Drawings

PHOTOPOLYMERIZABLE TRANSFER ELEMENTS

CROSS REFERENCE TO RELATED APPLICATIONS

This application is a continuation-in-part of my co-pending application Ser. No. 78,181, filed Oct. 5, 1970, now abandoned.

BACKGROUND OF THE INVENTION

1. Field of the Invention

This invention relates to new photopolymerizable elements.

2. Description of the Prior Art

There are various film elements useful for producing a copy of an image by photopolymerization techniques. One such element is disclosed in U.S. Pat. No. 3,353,955 which discloses a photopolymer layer laminated between substrates, e.g., a support and a cover sheet, at least one of which is transparent. The film element is exposed imagewise through the transparent film support or laminated transparent cover sheet, and light is transmitted through the clear background areas of the process image, exposing particular areas of the photopolymerizable layer causing these areas to harden and adhere to the transparent substrate through which the exposure was made. When the element is delaminated the transparent substrate bears a negative image of exposed and hardened polymer, leaving behind on the opposite substrate a complementary unpolymerized positive image of the original design. This system is characterized by the following: (a) the polymerized material always preferentially adheres to the substrate nearest the source of exposing radiation, (b) after exposure and delamination no part of the system is capable of complete image transfer at room temperature, (c) one substrate must be modified to improve adhesion, and (d) the optical density of the photopolymer layer when exposed to actinic radiation preferably must be equal to or greater than 0.8. The higher optical density prevents light from completely penetrating the photopolymerizable layer, thus the increase of adhesion on exposure occurs at the surface of the substrate nearest to the exposure source. This results in an image orientation opposite to that of the present invention. A disadvantage in using the above element is that ragged image edges are obtained which are caused by the high cohesion of the unpolymerized photopolymerizable layer.

Another photopolymerizable element is disclosed in U.S. Pat. No. 3,525,615. This element employs an ethylenically unsaturated photopolymerizable composition, a photoinitiator and an inorganic thixotropic binder. The element is exposed imagewise and image transfer is achieved by placing the element in intimate contact with an image receptive support. Direct force is then applied to the laminated structure causing liquefaction of the photopolymerizable material in the unexposed areas and transfer to the receptor is achieved.

U.S. Pat. No. 3,202,508 discloses a photopolymer process for image reproduction at room temperature which relies on pressure to obtain cohesive failure between the polymerized and unpolymerized material to separate the positive from the negative image.

The systems described in these latter two patents have problems in trying to maintain dimensional fidelity. Furthermore, the transferred image remains tacky and special precautions must be taken so that the unpolymerized transferred image is not destroyed or distorted.

The above patents relate to photopolymer systems which are in some way related to image reproduction. The present invention is similarly related, however, it is centered on providing a new and improved product, particularly useable as a photoresist in etching. The product is characterized as having a thin photopolymerizable layer with a low optical density permitting complete polymerization of the photopolymerizable layer, coupled with a low cohesive strength permitting easy separation of the polymerized and unpolymerized image areas. This photopolymerizable layer is coated between two substrates having different chemical attractions for the photopolymerizable layer; so that, after exposure, the polymerized area is attracted to the interface having the greater chemical affinity and on delamination of the supports the image areas separate. The unpolymerized area may be transferred, if desired, by pressure to a receptor. This permits the transfer of multiple images of complementary colors to be superimposed on one image receptor and thereby providing a system for colorproofing.

SUMMARY OF THE INVENTION

The photopolymerizable element of this invention comprises:

a. a polymer film support;

b. a photopolymerizable layer having a thickness when dry of at least 0.00005 inch and an optical density, in the actinic region when exposed to actinic radiation of not more than 0.7, said photopolymerizable layer containing i. at least one ethylenically unsaturated monomer having a boiling point above 100°C. at normal atmospheric pressure and at least one terminal ethylenic group capable of forming a high polymer by free radical initiated, chain propogated addition polymerization, ii. a macromolecular organic binder, said monomer being present in a quantity in excess of the absorptive capacity of the binder for the monomer so that a thin layer of substantially free monomer is present on the surface of the photopolymerizable layer, and iii. a free radical generating, addition polymerization initiating system activatable by actinic radiation; and c. a substrate adhered to the surface of the photopolymerizable layer opposite to the surface in contact with the film support, the adhesion of the polymerizable layer to the support film being greater before polymerization than it is to the substrate and less after polymerization than it is to the substrate.

In the preferred embodiment, the contact angle of the monomer on the film support should be at least 2° greater than that of the monomer on the substrate.

DESCRIPTION OF THE PREFERRED EMBODIMENTS

The substrate used in the practice of the present invention can be a temporary protective cover sheet (hereinafter referred to as a cover sheet) or a surface to be imaged. In both situations, the adhesion between the photopolymerizable layer and the support, before polymerization of the polymerizable layer, should be greater than that between the polymerizable layer and the substrate. After polymerization, the affinities between the various components of the element are reversed. The exposed, polymerized portions of the photopolymerizable layer have a greater adhesion to the substrate than to the support. Delamination of the substrate from the support will leave the polymerized portions of the polymerizable layer adhering to the substrate and the unpolymerized portions of the polymerizable layer adhering to the support.

In the situation where the substrate is a surface to be imaged, delamination after imagewise exposure of the element produces a negative image of the initial image on the surface to be imaged. In the situation where the substrate is a cover sheet, it should be non-polar and have little or no chemical affinity for the photopolymerizable layer so that it can be easily removed, prior to exposure, and said photopolymerizable layer laminated to a surface to be imaged, prior to exposure. Alternatively, when the substrate is a cover sheet, the element can be image-wise exposed with the cover sheet in place. Upon delamination, the polymerized areas adhering to the cover sheet may be discarded and the unpolymerized areas adhering to the support may be transferred by pressure to a receptor, e.g., paper. This permits the transfer of multiple images of complementary colors to be superimposed on one image receptor thereby providing a colorproofing system. The unpolymerized image on the receptor may be post exposed to harden it.

In all cases, it is important that the chemical affinity of the support for the unpolymerized material is sufficient to preclude retention of the latter on the surface to be imaged upon delamination of the exposed element.

The degree of chemical affinity of the photopolymerizable layer for the various other components can be determined by measuring the relative contact angles that the monomer makes with the surfaces of the support or the substrate when drops of the monomer are placed on those surfaces. The significance of the degree of chemical affinity is discussed more fully below.

The interfacial adhesion between a support and a photopolymerizable layer of this invention coated on the support is greater than that between the layer and the substrate applied thereto, for several reasons, namely:

1. the support film has greater chemical affinity for the photopolymerizable layer than does the substrate
2. the layer of excess monomer at the substrate interface has low cohesive strength; and
3. the photopolymerizable layer being fluid when applied to the support is in better physical conformity with the surface contours thereof than the layer is to the substrate which is applied to the photopolymerizable layer after drying.

The interfacial adhesion between a support and a photopolymerizable layer of this invention coated on the support is greater than that between the layer and a surface being imaged prior to imagewise exposure for reasons analogous to (2) and (3) above. However, after imagewise exposure the interfacial adhesion between the support and polymerized areas of the photopolymerizable layer is less than that between the polymerized areas of the layer and the substrate. This reversal of adhesive preference as a result of imagewise exposure is believed to be due in part to the greater chemical affinity of the substrate and in part to the fact that the thin layer of free monomer present at the interface of the photopolymerizable layer and the substrate has been polymerized during actinic exposure.

The photopolymerizable layer of the present invention may be prepared from an ethylenically unsaturated monomer containing at least one terminal ethylenic group capable of forming a high polymer by free radical initiated chain-propogated, addition polymerization as exemplified by the monomers described in U.S. Pat. No. 3,380,831. The ethylenically unsaturated monomer should have a boiling point above 100°C. at normal atmosphereic pressure, and a molecular weight of at least 150. It should be nonvolatile at room temperature and be present in the ratio of from 10 to not more than 90 parts by weight of monomer per 100 parts by weight of monomer-binder composition. Furthermore, it should be present in a quantity in excess of the absorptive capacity of the binder for the monomer so that a thin layer of substantially pure monomer is present on the surface of the photopolymerizable layer. In the preferred embodiment, the contact angle of the monomer on the film support should be at least 2° greater than that of the monomer on the substrate.

In addition to pentaerythritol triacrylate and trimethylolpropane triacrylate, the following monomers may be used:

1. ethylene glycol diacrylate and dimethacrylate;
2. diethylene glycol diacrylate;
3. glycerol diacrylate and triacrylate;
4. 1,3-propanediol diacrylate and dimethacrylate;
5. 1,2,4-butanetriol trimethacrylate;
6. 1,4-cyclohexanediol diacrylate;
7. 1,4-benzenediol dimethacrylate;
8. pentaerythritol tetraacrylate and tetramethacrylate;
9. 1,5-pentanediol diacrylate and dimethacrylate; and
10. trimethylolpropane triacrylate and trimethacrylate.

The binders useable in this system are macromolecular organic polymers, preferably having a molecular weight within the range of 2,000 to 75,000, and are capable of forming smooth, hard films. Suitable specific binders which can be used in place of those disclosed in the working examples below are the following:

1. vinylidene chloride copolymers, e.g., vinylidene chloride/acrylonitrile, vinylidene chloride/methyl methacrylate and vinylidene chloride/vinyl acetate;
2. ethylene/vinyl acetate copolymers;
3. cellulose ethers, e.g., methyl, ethyl and benzyl cellulose
4. synthetic rubbers, e.g., butadiene/acrylonitrile copolymers, chlorinated isoprene, and chloro-2-butadiene-1,3-polymers;
5. polyvinyl esters, e.g., polyvinyl acetate/acrylate, polyvinyl acetate/methyl methacrylate, and polyvinyl acetate;
6. polyacrylate and polyalkylacrylate esters, e.g., polymethyl methacrylate and polyethyl methacrylate, and
7. polyvinyl chloride and copolymers, e.g., vinyl chloride/vinyl acetate.

The type of binder chosen is significant from the standpoint that the binder controls the degree of cohesion imparted to the photopolymerizable layer. The cohesive properties of the unpolymerized material must be low if the adhesive forces are small. This is important if a clear sharp image is to be obtained when the polymerized material is separated from the unpolymerized material on delamination of the support and cover sheet after exposure. Organic binders which impart a high cohesive property to the photopolymerizable layer cause a tearing action when delaminating the polymerized from the unpolymerized material at room temperature and a blurred distorted image is obtained.

The photopolymerizable composition may also contain a pigment or dye to serve as a colorant, usually present in the amount of 1 – 60 parts by weight of pigment per 100 parts by weight of pigment-monomer. Some of the pigments which may be used are: the inorganic pigments such as clays, oxides of metal or synthetic organic materials which are insoluble in the medium in which they are dispersed. The pure organic compounds known as lakes may also be used. Suitable toners include the organic azo compounds and organic azine compounds while suitable lakes may be obtained by the use of the rhodamine pigments.

In addition, the photopolymerizable composition also contains a photoinitiator, used to start monomer polymerization, which is activated by actinic radiation and is present in the amount of 0.001 to 20 parts by weight of the monomer. Particulate material may also be added to the photopolymerizable composition, but the coated photopolymerizable layer must have an optical denisty of less than 0.70 in the actinic region.

To prepare the photopolymerizable composition the various ingredients are mixed together in their proper ratios and may be milled in a ball mill for a period of time, or mixed by rapidly stirring the composition sufficiently to obtain thorough mixing.

The prepared photopolymer is coated by various ways (doctor blade, skim, hopper, reverse roll) to a support, dried and a cover sheet or a surface to be imaged is then laminated to the photopolymerizble layer. The preferred dry coating thickness is 0.0002 inch to 0.001 inch. Lamination can be carried out at room temperature under a pressure of about 10 to about 100 psi. A significant aspect of this invention is the proper selection of substrate and support used with the photopolymerizable layer. The important property sought is the adhesive quality between the photopolymerizable layer and the support on one side and the cover sheet or surface to be imaged on the other. The selection of support and cover sheet or surface to be imaged to give the desired adhesive quality needed is made by balancing the chemical affinities of the two surfaces to the photopolymerizable layer. It has been found that the degree of chemical affinity which controls the reactivity of the surface of the support with the photopolymerizable layer is highly dependent on the chemical polarity of the support. A nonpolar surface means little reactivity of the surface while a high chemical polarity means that the surface has a high degree of chemical reactivity (especially hydrogen bonding) when the surface molecules of the support carry a high dipole moment. For example, exposure of a photopolymerizable element wherein the photopolymerizable layer is laminated to a highly polar substrate on one side and a relatively nonpolar support on the other results in interaction between the reactivity centers of the polar substrate and the polymerized monomer to create a strong adhesive bond. A certain amount of reactivity also occurs between the polymerized material and the relative nonpolar cover sheet. When the degrees of polarity of the two surfaces are diverse enough the polymerized areas will preferentially adhere to the more polar surface.

One method of showing the different degrees of the chemical affinity of various materials for a liquid is to compare their relative contact angles. Following, in tabulated form, are samples of various materials where the contact angle has been measured by placing liquid pentaerythritol triacrylate monomer on the surface of the material and measuring the contact angle of the monomer with the surface by a Gaertner goniometer.

| Sample No. | Surface | Contact Angle in Degrees |
|---|---|---|
| 1 | Polyethylene – untreated, 0.001-inch-thick | 42 |
| 2 | Polypropylene – untreated, 0.001-inch | 40 |
| 3 | Copper – Polished surface | 14 |
| 4 | Polyethylene terephthalate – untreated, 0.001-inch | 20 |
| 5 | Polyethylene terephthalate – aluminized, 0.002-inch | 11 |
| 6 | Paper –]Komekote | ≈10 |

The data above shows that as the free energy or chemical polarity of the material increases, the contact angle decreases, thus improving the wettability of the material by the monomer. For best results the support and substrate combination is chosen so that their contact angles with the monomer of the photopolymerizable composition used are very different. from the above data, it would appear that the best combination of support and substrate would be 0.001 inch thick untreated polyethylene of Sample 1 or untreated polyethylene terephthalate of Sample 4 as the support combined with aluminized polyethylene terephthalate of Sample 5 the paper of Sample 6 or a metal such as copper as the substrate. However, the poor mechanical properties of polyethylene would seem to preclude its use as a support. This simple technique gives relative values which are sufficient to predict which materials are suitably matched, for use as a support and a cover sheet or a surface to be imaged in the photopolymerizable peel-apart systems described herein.

The surface of the support may be treated to change the degree of chemical affinity. For example, the surface may be exposed to an electrical discharge as described in U.S. Pat. No. 3,113,208 or exposed to an air propane flame as described in U.S. Pat. No. 3,145,242.

When the support and the cover sheet are chosen so that the support is relatively nonpolar and the cover sheet is relatively polar, the polymerized material (which is generally of a polar nature) in the photopolymerizable element will preferentially adhere to the polar surface irrespective of whether exposure is made through the cover sheet or through the support provided that the support on the exposure side admits sufficient actinic radiation to completely polymerize the photopolymerizable layer in the exposed region.

Complete polymerization of the photopolymerizable layer is assured if a transmission optical density of the layer, when exposed to actinic radiation, is no greater than 0.7 in the actinic region used for exposure. The term transmission optical density is used to mean a measurement of the opacity of the photopolymerizable layer. As a mathematical expression of optical density the intensity of incident light ($I_o$) is related to the intensity of transmitted light ($I_t$) in the following manner. Log $I_o/I_t$ is equal to $abc/2.3$ where $I_o$ is equal to the intensity of incident light, $I_t$ is equal to the intensity of transmitted light, $a$ is equal to the extinction coefficient of absorbent, $b$ is equal to the thickness of the photopolymerizable layer and $c$ is equal to the concentration of initiator or absorbent. The theory behind this formula is discussed in Mees, "The Theory of Photographic Processes", the Macmillian Co., New York (1954pp. 816–817. A commercial instrument useable in measuring the optical density is a Cary Spectrophotometer, Model No. 14 MS manufactured by Varian Corp.

The photopolymerizable elements of the present invention are useful in a variety of image transfer systems. For example, they are useful as resists for making printed circuits. The elements are also useful in the printing arts, e.g., in making lithographic offset printing plates and in making color proofs. The elements are useful in the decalcomania art and in making metal nameplates. The advantages in using the elements are many. They are used in completely dry systems, requiring no liquid treatments for developing or transferring the images.

This invention will be further illustrated by the following examples.

EXAMPLE I

A photopolymerizable composition was prepared with the following ingredients:

| | |
|---|---|
| Polymethyl methacrylate (Inherent Viscosity: 0.20 – 0.22 for a solution of 0.25 g in 25 mils chloroform, at 20°C using a No. 50 Cannon-Fenski Viscosimeter) | 0.32 g |
| Chlorinated rubber (Parlon S-5 by Hercules Powder Co.) (67% chlorinated rubber - 20% solution in toluene at 25°C has a viscosity of 4 – 7 centipoises) | 1.9 g |
| Pentaerythritol triacrylate | 4.8 g |
| 9,10-phenanthrenequinone | 0.15 g |
| 2,2′-methylene-bis-(4-ethyl-6-t-butylphenol) | 0.14 g |
| Trichloroethylene | 70.0 g |

The ingredients were thoroughly mixed and coated using a 0.002-inch doctor knife on a 0.001-inch transparent polyethylene terephthalate base which showed a contact angle with the monomer of 20°. The optical density of the photopolymerizable layer when measured by a Carey No. 14 Spectrophotometer at a wavelength of 3,600 A was 0.42. After drying the coating, the surface of the photopolymerizable layer was laminated at room temperature with a pressure of 10 pounds/sq.in. to the aluminized surface of 0.002 inch thick polyethylene terephthalate film on which a drop of the monomer gave a contact angle of 9°. The resulting element was imagewise exposed for 40 seconds under vacuum to a photographic image of a nameplate through the transparent film support by means of a carbon arc source. After exposure, the supports were delaminated and the hard, exposed, polymerized image of the nameplate adhered to the aluminized polyethylene terephthalate film having the lower contact angle and the unpolymerized image areas adhered to the transparent film support. Resolution studies indicated that 5-mil (0.005-inch) lines could be resolved. This latter unpolymerized image can be hardened by an overall exposure to the carbon arc or can be transferred to a receptor sheet by placing the unpolymerized material in contact with said receptor sheet, applying pressure and then delaminating the clear film support. This transferred image may also be hardened by an overall exposure to the carbon arc. The resulting images were suitable for use as etchable resists. An element was also made by laminating the surface of the coated photopolymerizable layer to a 0.001-inch copper foil adhered to a polyethylene terephthalate film having a thickness of 0.002-inch. The copper surface had a contact angle with a drop of the monomer of 13°. After exposure and delamination, a good, hard image adhered to the copper surfaced film. A film imaged in this manner offers a good resist for the preparation of etched, flexible, printed circuits.

EXAMPLE II

A photopolymerizable composition was prepared with the following ingredients:

| | |
|---|---|
| Polymethyl methacrylate (see Example I) | 0.32 g |
| Chlorinatd rubber (Parlon S-5) (see Example I) | 1.9 g |
| Trimethylolpropane triacrylate | 4.0 g |
| 2-t-Butylanthraquinone | 0.25 g |
| 2,2′-Methylene-bis-(4-ethyl-6-t-butylphenol) | 0.14 g |
| Trichloroethylene | 74.0 g |

The mixing, coating, drying, laminating to aluminized polyethylene terephthalate film and exposure was carried out as described in Example 1. The optical density at 3,6000 A was 0.28. The contact angle of a drop of the monomer on the transparent polyethylene terephthalate film was 7° and on the aluminized surface it was 6°. Upon delamination after exposure, some exposed and unexposed image separation was obtained but results were definitely inferior to those obtained in Example I due to the nonfunctional difference in the chemical affinities of the two film surfaces for the exposed photopolymerized image areas as indicated by the small difference in contact angles.

When the coating was laminated to a clean copper-clad epoxy Fiberglass board (contact angle 4° with trimethylolpropane triacrylate) good image quality was obtained upon delamination after exposure and etching, indicating that larger differences between contact angles improve image quality

EXAMPLE III

A photopolymerizable composition was prepared with the following ingredients:

| | |
|---|---|
| Polymethyl methacrylate (Example I) | 1.0 g |
| Pentaerythritol triacrylate | 4.8 g |
| 2-t-Butylanthraquinone | 0.25 g |
| 2,2′-Methylene-bis-(4-ethyl-6-t-butylphenol) | 0.14 g |
| Trichloroethylene | 70.0 g |

The ingredients were mixed, coated, dried, laminated, and exposed as described in Example I. The optical density at 3,600 A was 0.29. Upon delamination at room temperature, good quality images were obtained which showed a resolution of about 10 mils. The exposed areas of the image adhered to the aluminized surface of a sheet of polyethylene terephthalate film.

EXAMPLE IV

A photopolymerizable composition was prepared using the following ingredients:

| | |
|---|---|
| Chlorinated rubber (Parlon S-5)(Example I) | 42.0 g |
| Pentaerythritol triacrylate | 65.0 g |
| 2-t-Butylanthraquinone | 6.0 g |
| 2,2′-Methylene-bis-(4-ethyl-6-t-butylphenol) | 0.6 g |
| Victoria Pure Blue (C.I. 44045) Dye | 2.0 g |
| Trichloroethylene | 455.0 g |

The above components were mixed for about 30 minutes with a magnetic stirrer to form a clear coating solution. The mixture was skim coated on a 0.001-inch-thick polyethylene terephthalate film support having a contact angle with the monomer of 17° and dried at 120°F to give a dried coating thickness of 0.00025-inch and then laminated with a 0.001-inch-thick polytrifluoroethylene film. The optical density at 3,600 A was 0.37. Before exposure the laminated film was removed and the surface of the photosensitive layer was pressure laminated at room temperature and a pressure of 10 pounds/sq.in. to a copper surface which had been cleaned with trichloroethylene and air-dried and which gave a contact angle with the monomer of 14°. The element was exposed through the clear film support to a photographic transparency of a printed circuit for 90 sec. in a vacuum frame to a carbon arc emitting radiation in the region of 3,200–8,000 A in an exposing device identified as a nuArc Plate Maker manufactured by the nuArc Company, Chicago, Ill. The film support was stripped off at room temperature leaving a hardened image adhering to the copper surface. The hardened image served as a resist while etching the copper in a conventional ferric chloride solution or ammonium persulfate. After etching to form a printed circuit, the resist image is removed by washing with trichloroethylene. The imaged layer showed an image resolution of about 8 mils.

EXAMPLE V

A photopolymerizable composition was prepared with the following ingredients:

| | |
|---|---|
| Polymethyl methacrylate (Example I) | 93.0 g |
| Chlorinated rubber (Parlon S-5)(Example I) | 286.0 g |
| Pentaerythritol triacrylate | 435.0 g |
| 2-t-Butylanthraquinone | 39.5 g |
| Triethylene glycol diacetate | 38.0 g |
| 2,2'-Methylene-bis-(4-ethyl-6-t-butylphenol) | 32.5 g |
| Victoria Pure Blue (C.I. 44045) Dye | 8.0 g |
| Trichloroethylene | 356.50 g |

The resulting mixture was coated, dried, laminated and otherwise handled in the same manner as Example IV. The optical density was 0.31. Excellent resist images were obtained on the copper surface which gave 10-mil resolution.

EXAMPLE VI

A photopolymerizable composition was prepared from the following ingredients:

| | |
|---|---|
| Chlorinated rubber (Parlon S-5)(Example I) | 42.0 g |
| Polymethyl methacrylate (see Example I) | 3.1 g |
| Pentaerythritol triacrylate | 40.0 g |
| 2-t-Butylanthraquinone | 4.4 g |
| Triethylene glycol diacetate | 4.8 g |
| 2,2'-Methylene-bis-(4-ethyl-6-t-butylphenyl) | 4.8 g |
| Victoria Pure Blue (C.I. 44045) Dye | 2.0 g |
| Carbon black (1 part carbon black/1 part polymethacrylate in trichloroethylene — 13% solids) | 0.3 g |
| Trichloroethylene | 225.0 g |

The ingredients were thoroughly mixed and coated, dried, laminated and otherwise handles as in Example IV. The optical density was 0.32. Excellent resist images were obtained which were capable of 2-mil resolution. An advantage of the above formula is that the coated layer could be overexposed 25 percent with no noticeable affect on image quality or resolution.

EXAMPLE VII

A photopolymerizable composition was prepared using the following ingredients:

| | |
|---|---|
| Chlorinated rubber (Parlon S-5)(Example I) | 64.0 g |
| Polymethyl methacrylate (Example I) | 7.8 g |
| Pentaerythritol triacrylate | 160.0 g |
| 2-t-Butylanthraquinone | 8.8 g |
| Triethylene glycol diacetate | 9.6 g |
| 2,2'-Methylene-bis-(4-ethyl-6-t-butylphenol) | 9.6 g |
| Carbon black (Example VI) | 0.3 g |
| Trichloroethylene | 2080.0 g |

The above ingredients were thoroughly mixed, coated, dried and otherwise handled as described in Example I. The optical density was 0.25. The imagewise exposure to the carbon arc was for 12 seconds. Image quality was excellent and capable of 0.003-inch resolution. The aluminum surface was etched with a 15 percent aqueous sodium hydroxide solution. This type of photopolymerizable element could be used for a variety of purposes including the production of nameplates and photographic halftone screens.

EXAMPLE VIII

A photopolymerizable composition was prepared using the following ingredients:

| | |
|---|---|
| Chlorinated rubber (Parlon S-5)(Example I) | 16.0 g |
| Polymethyl methacrylate (Example I) | 3.1 g |
| Pentaerythritol triacrylate | 20.0 g |
| 2-t-Butylanthraquinone | 2.2 g |
| Triethylene glycol diacetate | 2.4 g |
| 2,2'-Methylene-bis-(4-ethyl-6-t-butylphenol) | 2.4 g |
| Carbon black (Example VI) | 0.32 g |
| Victoria Pure Blue (C.I. 44045) Dye | 0.10 g |
| Trichloroethylene | 125.0 g |

The above ingredients were thoroughly mixed and coated on 0.001-inch-thick polyethylene terephthalate film. The optical density was 0.34. After drying, the surface of the photopolymerizable layer was laminated to the surface of a copper sheet. After exposure and delamination as described above an image capable of 6-mil resolution was obtained. Another sample identical with the above was, after exposure, heated by passing through a set of hot rollers at 100°C. After the sample cooled and was delaminated, 2-mil resolution was obtained. Heating and cooling before delamination improved stripping so that a clearer, sharper separation of the images was obtained.

EXAMPLE IX

A coating composition was prepared from the following ingredients:

| | |
|---|---|
| Vinyl chloride copolymer (cps. in methyl ketone/acetone at 25%) (Geon 222 - B. F. Goodrich Chemical Company) | 52.0 g. |
| Pentaerythritol triacrylate | 40.0 g. |
| 2-t-Butylanthraquinone | 2.6 g. |
| Triethylene glycol diacetate | 5.1 g. |
| Pontacyl Wool Blue GL (C.I. 50315) | 0.30 g. |
| Trichloroethylene | 200.0 g. |

The ingredients were thoroughly mixed, filtered, and coated on a 0.001-inch polyethylene terephthalate film and dried to give a dry coating thickness of 0.00055-inch. The optical density was 0.19. The liquid monomer had a contact angle with the film of 20°. The surface of the photopolymerizable layer was laminated to a copper-clad epoxy-Fiberglas board having a contact angle of 15°. The element was exposed through the 0.001-inch film support to a photographic image of a printed circuit pattern using the exposing device described in Example IV. Upon delamination of the 0.001-inch film support, a hard, exposed image of the printed circuit was left on the copper-clad board. The imaged copper board was etched in 42° Baume' aqueous ferric chloride to give a printed circuit.

EXAMPLE X

Example V was repeated except that several coatings on polyethylene terephthalate films were laminated to copper-clad epoxy-Fiberglas boards each of which had been treated by scrubbing with pumice, washing with water and then rinsing the boards with ½ N solutions of strontium chloride, sodium chloride, aluminum chloride, calcium chloride, sodium acetate, copper nitrate and copper acetate, respectively. These treatments lowered the contact angle to 10° from 15° for a board pumiced clean and water rinsed only. Whereas after exposure the polymerized image adhering to the untreated copper surface of Example V showed a capability of 10-mil resolution, images adhering to the treated boards after delamination showed capabilities of 6 mil resolution. In previous laminated elements involving untreated metal surfaces, the stripping rate during delamination was somewhat critical. Using treated metal surfaces as described above, stripping rate sensitivity became much less critical.

EXAMPLE XI

A sample of the element of Example VII was exposed and delaminated as described. The soft, unpolymerized image remaining on the polyethylene terephthalate film support was then toned by a pigment of Aniline Black (C.I. 50440) by applying it with a cotton swab and wiping away the excess. This gave a high quality image suitable for color proofing. A sample color proof was also prepared by superimposing two images, one toned with Aniline Black and the other with a red pigment identified as (C.I. 45160). A color proofing system using the elements of this invention has the advantage of providing stain-free color proofs having better color density.

EXAMPLE XII

A photopolymerizable composition was prepared from the following ingredients:

| | |
|---|---|
| Chlorinated rubber (Parlon S-5) (Example I) | 160.0 g |
| Polymethyl methacrylate (Example I) | 22.0 g |
| Pentaerythritol triacrylate | 200.0 g |
| 2-t-Butylanthraquinone | 22.0 g |
| Triethylene glycol diacetate | 24.0 g |
| Tri-n-butyl phosphate | 7.5 g |
| 2,2'-Methylene-bis-(4-ethyl-6-t-butylphenol) | 25.0 g |
| Trichloroethylene | 1200.0 g |

The above ingredients were thoroughly mixed and coated on a 0.001-inch-thick polyethylene terephthalate film base and laminated with a 0.004-inch-thick gelatine-coated polyethylene terephthalate film (contact angle was 10°) made in the manner described in Alles, U.S. Pat. No. 2,779,684. The optical density was 0.35. A sample was exposed to an image transparency by means of a carbon arc for 2 minutes through the 0.001-inch support by means of the exposing device described above and then passed through heated rollers (100°C.), cooled to room temperature and delaminated. Only the soft unexposed image remained on the 0.001-inch support and the exposed image adhered to the hardened, gelatin-coated film. The soft, unexposed image was toned with a phthalocyanine blue pigment identified as C.I. 74160—by rubbing the image lightly with a cotton swab dipped in the pigment. The excess pigment was wiped clean. The toned image was placed against an offset lithographic-coated paper stock and passed through heated rollers (100°C.) separating the paper and the film support as the element passed through the rollers. The image transferred to the paper, providing an image suitable for color proofing.

EXAMPLE XIII

A photopolymerizable composition was prepared from the following ingredients:

| | |
|---|---|
| Chlorinated rubber (Du Pont Neoprene) (Polychloroprene) | 47.85 g |
| Pentaerythritol triacrylate | 64.75 g |
| 2-t-Butylanthraquinone | 6.49 g |
| Triethylene glycol diacetate | 9.25 g |
| 2,2'-Methylene-bis-(4-ethyl-6-t-butylphenol) | 0.65 g |
| Grasol Fast Red BL dye (C.I. 13900) | 0.10 g |
| Dichloromethane | 870.0 g |

The above ingredients were thoroughly mixed and coated on a 0.001-inch thick polyethylene terephthalate film support and air dried. The optical density was 0.36. The surface of the coated layer was then laminated to a copper-clad rigid phenolic resin board by passing the positioned surfaces through hot rollers (100°C.). The resulting element was exposed for 2 minutes in the exposing device described in Example IV. The exposed element was delaminated at room temperature to give a good hard image on the copper surface with the unexposed areas remaining on the film support.

EXAMPLE XIV

A photopolymerizable composition was prepared from the following ingredients:

| | |
|---|---|
| Chlorinated rubber (Example XII) | 40.30 g |
| Polymethyl methacrylate (Example I) | 29.40 g |
| Pentaerythritol triacrylate | 24.20 g |
| 2-t-Butylanthraquinone | 2.40 g |
| Triethylene glycol diacetate | 3.40 g |
| 2,2'-Methylene-bis-(4-ethyl-6-t-butylphenol) | 0.17 g |
| Grasol Fast Red BL dye (C.I. 13900) | 0.02 g |
| Trichloroethylene | 1750.00 g |

The above ingredients were mixed, coated, dried and otherwise handled as described in Example XII to give good quality, well delineated images. The optical density was 0.17.

EXAMPLE XV

A photopolymerizable composition was prepared from the following ingredients:

| | |
|---|---|
| Chlorinated rubber (Parlon S-5)(Example I) | 6.00 g |
| Pentaerythritol triacrylate | 8.00 g |
| 2-t-Butylanthraquinone | 0.50 g |
| Triethylene glycol diacetate | 1.50 g |
| 2,2'-Methylene-bis-(4-ethyl-6-t-butylphenol) | 0.50 g |
| Victoria Pure Blue (C.I. 44045) Dye | 0.06 g |
| Methylene chloride | 32.00 g |

The ingredients were thoroughly mixed and coated on 0.001-inch polyethylene terephthalate film support. Samples of the film were measured in a Cary Model No. 14 Spectrophotometer to determine the optical density. At a wavelength of 3,800 A the density was 0.26, and at a wavelength of 3,600 A the density was 0.60. These wavelengths are in the actinic region at which the layers will photopolymerize. Lamination to a copper surface, exposure and delamination could be carried out as described in the above examples. The resist image thus produced on the copper was useful as an etching resist in ferric chloride.

EXAMPLE XVI

A photopolymerizable composition was prepared from the following ingredients:

| | |
|---|---|
| Chlorinated rubber (Parlon S-5)(Example I) | 15.0 g |
| Pentaerythritol triacrylate | 18.0 g |
| Michler's Ketone (tetramethyl-p,p'-diaminobenzophenone) | 1.2 g |
| Benzophenone | 1.2 g |
| Triethylene glycol diacetate | 0.6 g |
| 2,2'-Methylene-bis-(4-ethyl-6-t-butylphenol) | 1.2 g |
| Victoria Pure Blue (C.I. 44045) Dye | 0.2 g |
| Methylene chloride | 50.0 g |

The ingredients were thoroughly mixed, coated, dried and otherwise handled as described in Example I, the surface of the photosensitive layer being laminated to a copper metallized polyethylene terephthalate film. The optical density at 4,200 A was 0.35. A good quality image was obtained on exposure and delamination.

What is claimed is:

1. A photopolymerizable element comprising:

a. a polymer film support;

b. a photopolymerizable layer having a thickness when dry of at least 0.00005 inch and an optical density, in the actinic region when exposed to actinic radiation of not more than 0.7, said photopolymerizable layer containing i. at least one ethylenically unsaturated monomer having a boiling point above 100°C. at normal atmospheric pressure and at least one terminal ethylenic group capable of forming a high polymer by free radical initiated, chain-propogated, addition polymerization, ii. a macromolecular organic binder, said monomer being present in a quantity in excess of the absorptive capacity of said binder for said monomer so that a thin layer of substantially free monomer is present on the surface of said photopolymerizable layer, and iii. a free radical generating, addition polymerization initiating system activatable by actinic radiation; and c. a substrate adhered to the surface of the photopolymerisable layer opposite to the surface in contact with the film support, the adhesion of said polymerizable layer to said support being greater before polymerization than it is to said substrate and less after polymerization than it is to said substrate, at least one of said film supports or said substrate being transparent to actinic radiation.

2. An element according to claim 1 wherein the contact angle of said monomer on said film support is at least 2° greater than that of said monomer on said substrate.

3. An element according to claim 2 wherein said film support is polyethylene terephthalate and said substrate is metal.

4. An element according to claim 2 wherein said film support is polyethylene terephthalate and said substrate is metallized polyethylene terephthalate.

5. An element according to claim 2 wherein said film support is polyethylene terephthalate and said substrate is hardened gelatin-coated polyethylene terephthalate.

6. An element according to claim 2 wherein said monomer is pentaerythritol triacrylate and said polymer binder is a halogenated organic polymer or copolymer.

7. An element according to claim 2 wherein said monomer is pentaerythritol triacrylate and said polymer binder is chlorinated rubber.

8. An element according to claim 2 wherein said monomer is trimethylolpropane triacrylate and said polymer binder is chlorinated rubber.

9. An element according to claim 2 wherein said substrate is a temporary cover sheet.

10. An element according to claim 2 wherein said substrate is a surface to be imaged.

* * * * *